(12) United States Patent
Heo

(10) Patent No.: US 8,575,605 B2
(45) Date of Patent: Nov. 5, 2013

(54) ORGANIC LIGHT-EMITTING DISPLAY DEVICE AND METHOD OF MANUFACTURING THE SAME

(75) Inventor: Seong-Kweon Heo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/312,577

(22) Filed: Dec. 6, 2011

(65) Prior Publication Data

US 2012/0205647 A1    Aug. 16, 2012

(30) Foreign Application Priority Data

Feb. 11, 2011    (KR) .................. 10-2011-0012407

(51) Int. Cl.
*H01L 29/10* (2006.01)
(52) U.S. Cl.
USPC .............. 257/43; 257/40; 257/61; 257/66; 257/72; 257/E21.04; 438/99; 438/104; 438/151; 438/158

(58) Field of Classification Search
None
See application file for complete search history.

(56) References Cited

U.S. PATENT DOCUMENTS

| 7,402,506 B2 * | 7/2008 | Levy et al. ..................... 438/584 |
| 2007/0108446 A1 * | 5/2007 | Akimoto .......................... 257/61 |
| 2010/0117078 A1 * | 5/2010 | Kuwabara et al. .............. 257/43 |

FOREIGN PATENT DOCUMENTS

| KR | 10-0847846 B1 | 7/2008 |
| KR | 10-2010-0085331 | 7/2010 |

\* cited by examiner

*Primary Examiner* — Kyoung Lee
(74) *Attorney, Agent, or Firm* — Christie, Parker & Hale, LLP

(57) ABSTRACT

An organic light-emitting display device includes: a substrate having a transistor region and a thin-film transistor having a gate electrode, a source/drain electrode and an active layer sequentially formed on the transistor region, wherein a portion of the source/drain electrode is between the active layer and substrate.

13 Claims, 17 Drawing Sheets

ORGANIC LIGHT-EMITTING DISPLAY DEVICE AND METHOD OF MANUFACTURING THE SAME

This application claims priority to and the benefit of Korean Patent Application No. 10-2011-0012407, filed on Feb. 11, 2011, in the Korean Intellectual Property Office, the disclosure of which is incorporated herein by reference in its entirety.

BACKGROUND

1. Field

Aspects of one or more embodiments according to the present invention relate to an organic light-emitting display device and a method of manufacturing the same.

2. Description of the Related Art

The rapid development of the information and technology (IT) industry has dramatically increased the use of display devices. Recently, there have been demands for display devices that are lightweight and thin, consume low power, and provide high resolution. To meet these demands, liquid crystal displays or organic light-emitting displays using organic light-emitting characteristics are being developed.

Organic light-emitting displays, which are next-generation display devices having a self light-emitting characteristic, have better characteristics than liquid crystal displays in terms of viewing angle, contrast, response speed, and power consumption, and can be manufactured to be thin and lightweight since a backlight is not used.

An organic light-emitting display includes a substrate having a pixel region and a non-pixel region, and a container (or another substrate) which is placed to face the substrate for encapsulation and is attached to the substrate by a sealant such as an epoxy. In the pixel region of the substrate, a plurality of organic light-emitting devices are arranged in a matrix pattern between scan lines and data lines to form pixels. In the non-pixel region, there are the scan lines and the data lines extending from the pixel region, power source supply lines for operating the organic light-emitting devices, and a scan driver and a data driver for processing signals received from an external source via input pads, and providing the processed signals to the scan lines and the data lines, respectively.

Hereinafter, the structure of a conventional organic light-emitting display device and a method of manufacturing the conventional organic light-emitting display device will be described with reference to FIGS. 1A, 1B, and 2. FIGS. 1A and 1B are cross-sectional views of a conventional organic light-emitting display device. FIG. 2 is a flowchart illustrating a conventional method of manufacturing an organic light-emitting display device.

Referring to FIG. 1A, the conventional organic light-emitting display device includes gate electrodes GATE formed at a transistor region TFT and a capacitor region Cst of a substrate, a gate insulating film formed on the gate electrodes GATE to insulate the gate electrode GATE of the transistor region TFT from an active layer OXIDE which is made of an oxide, and the active layer OXIDE formed above the gate electrode GATE of the transistor region TFT.

The active layer OXIDE made of an oxide may be formed by the same or similar process as an active layer made of amorphous silicon. The active layer OXIDE made of an oxide enables a thin-film transistor to be driven with precision and to operate several tens of times faster than a conventional active layer made of polysilicon does. However, the oxide is sensitive to the air.

For this reason, as shown in FIG. 1A, an etch stop layer ESL is additionally formed on the active layer OXIDE. Then, source/drain electrodes S/D which are connected to the active layer OXIDE via contact holes formed at the etch stop layer ESL, a passivation film PSV, a pixel electrode PXL_E, and a pixel defining layer PDL are sequentially formed.

In this structure, the gate electrodes GATE, the active layer OXIDE, and the source/drain electrode S/D are sequentially stacked from the bottom. Thus, as shown in FIG. 1B, this structure inevitably produces an overlap area OL between the source/drain electrodes S/D and the gate electrode GATE at the transistor region TFT.

This is because the source/drain electrodes S/D of the transistor region TFT are formed on the oxide active layer OXIDE and are connected to the oxide active layer OXIDE by the contact holes.

Due to this structure, undesirable parasitic capacitance is generated between the gate electrode GATE and the source/drain electrodes S/D of the transistor region TFT, thereby deteriorating the performance of a transistor that constitutes the conventional organic light-emitting display device.

Referring to FIG. 2, in a conventional method of manufacturing an organic light-emitting display device, gate electrodes, an active layer, an etch stop layer, source/drain electrodes, a passivation film, a pixel electrode, and a pixel defining layer are sequentially formed by patterning processes using patterning masks (operations S1 through S7).

That is, each operation uses at least one mask to form a photoresist film used in a partial etching process for patterning. Accordingly, the total number of processes is increased, which, in turn, raises manufacturing costs. This is because when an active layer is formed using an oxide that is sensitive to the air, an etch stop layer is additionally used to protect the active layer.

In this regard, an organic light-emitting display device which can be mass-produced in a simplified process with an active layer formed of an oxide and a method of manufacturing the organic light-emitting display device are desired.

SUMMARY

Aspects of embodiments according to the present invention are directed toward an organic light-emitting display device including an oxide active layer which forms a high-efficiency thin-film transistor.

Aspects of embodiments according to the present invention also are directed toward an organic light-emitting display device in which unnecessary parasitic capacitance between a gate electrode and a source/drain electrode is reduced thereby to improve the performance of a thin-film transistor.

Aspects of embodiments according to the present invention also are directed toward a method of manufacturing an organic light-emitting display device, which includes an active layer made of an oxide, in an improved manner in terms of processing time and cost using a reduced number of processes.

However, the present invention is not restricted to the embodiments set forth herein. The above and other aspects of the present invention will become more apparent to one of ordinary skill in the art to which the present invention pertains by referencing the detailed description of embodiments according to the present invention given below.

According to an embodiment of the present invention, there is provided an organic light-emitting display device including a substrate having a transistor region and a thin-film transistor having a gate electrode, a source/drain electrode and an active layer sequentially formed on the substrate at the transistor region, wherein a portion of the source/drain electrode is between the active layer and the substrate. Portions of a back surface of the active layer are in contact with the source/drain electrode.

According to another embodiment of the present invention, there is provided a method of manufacturing an organic light-emitting display device. The method includes: forming gate electrodes and pixel electrodes on a substrate having a pixel region, a transistor region, and a capacitor region; forming a gate insulating film on the gate electrodes; forming source/drain electrodes on the gate insulating film; forming an active layer on the source/drain electrodes of the transistor region; and forming a passivation film and a pixel defining layer, and then etching the passivation film and the pixel defining layer of the pixel region to expose the pixel electrode of the pixel region, wherein a portion of the source/drain electrodes of the transistor region is between the active layer and the substrate. Portions of a back surface of the active layer are in contact with the source/drain electrodes.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Figure 1A:
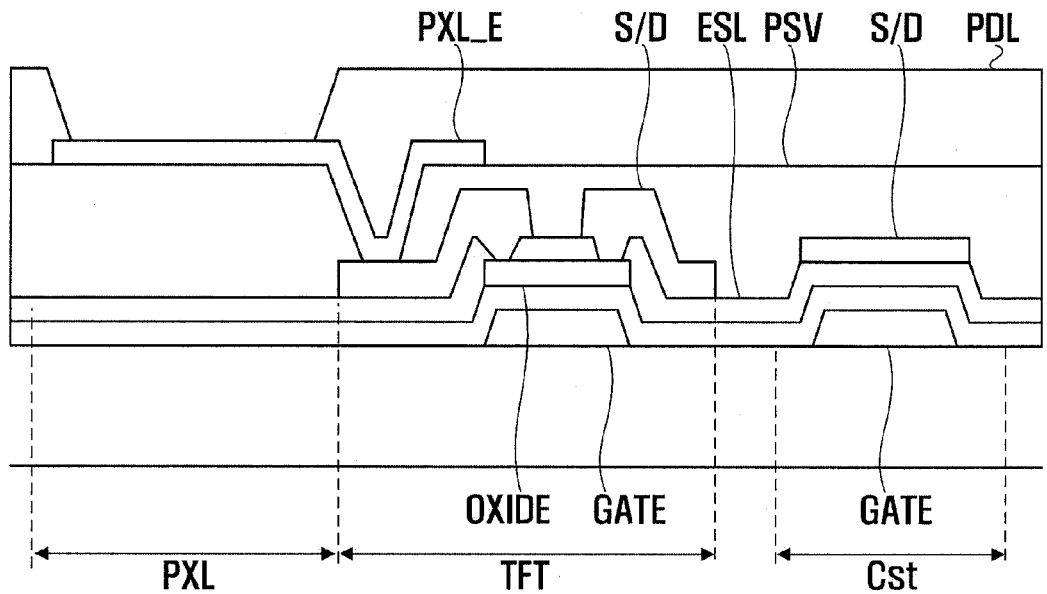
FIGS. 1A and 1B are cross-sectional views of a conventional organic light-emitting display device.

Aspects and features of one or more embodiments according to the present invention and methods of accomplishing the same may be understood more readily by referring to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the scope of the present invention will be defined by the appended claims and equivalents thereof. In the drawings, sizes and relative sizes of layers and regions may be exaggerated for clarity.

It will be understood that when an element or layer is referred to as being "on" another element or layer, the element or layer can be directly on another element or layer, or one or more intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe the relationship between one element or feature and another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the present invention are described herein with reference to plan and cross-section illustrations that are schematic illustrations of exemplary embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Figure 3A:
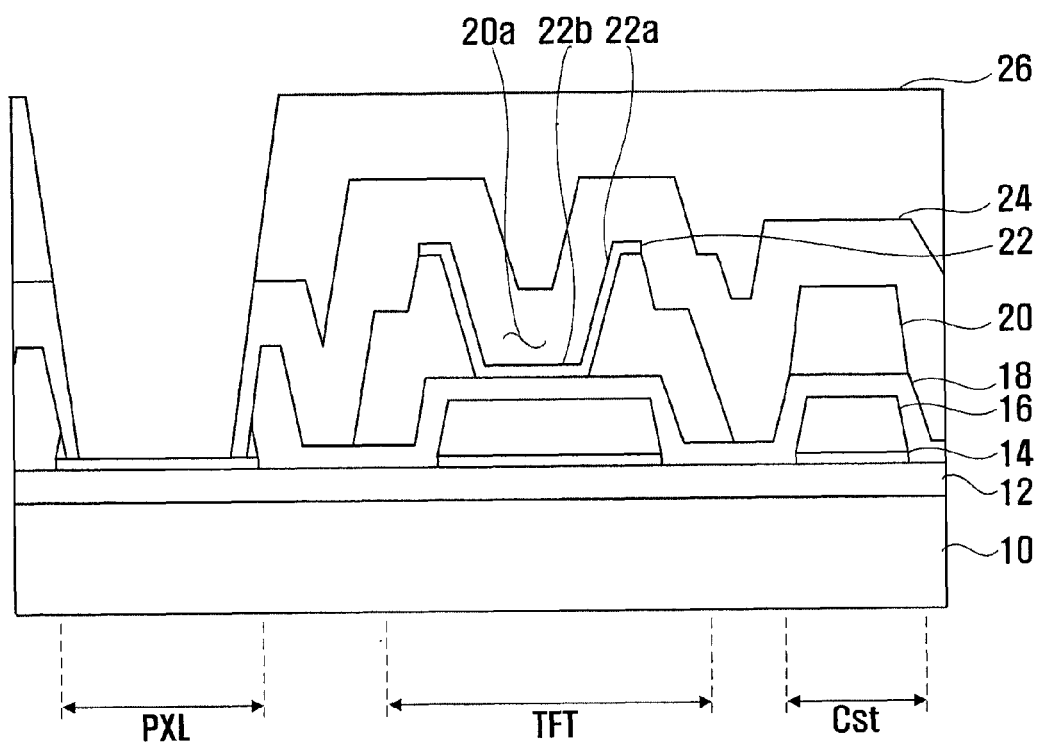
FIGS. 3A through 3C are cross-sectional views of organic light-emitting display devices according to exemplary embodiments of the present invention.
Figure 3B:
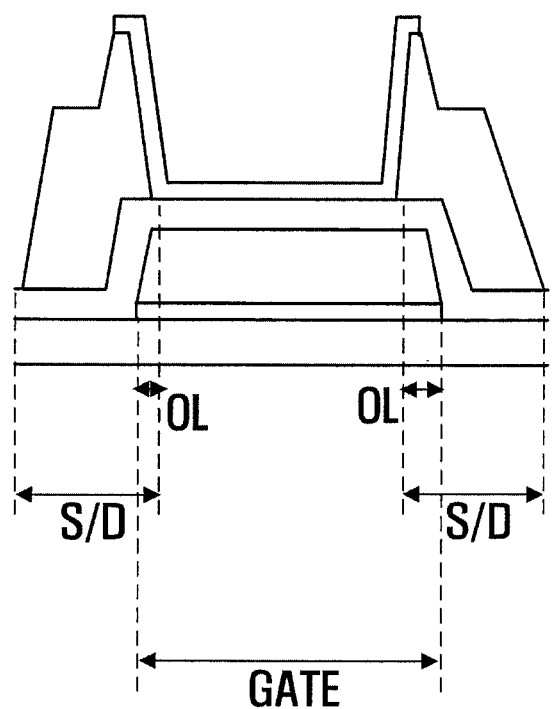
Figure 3C:
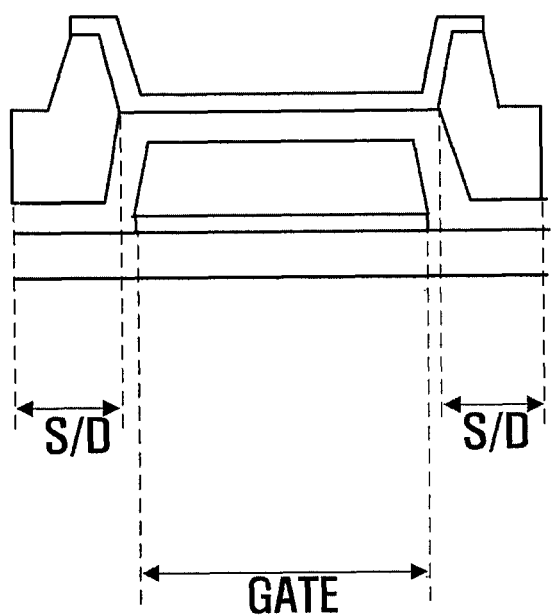

Hereinafter, organic light-emitting display devices according to exemplary embodiments of the present invention will be described with reference to FIGS. 3A through 3C. FIGS. 3A through 3C are cross-sectional views of organic light-emitting display devices according to exemplary embodiments of the present invention.

An organic light-emitting display device according to an exemplary embodiment of the present invention includes a substrate 10 having a transistor region TFT and a thin-film transistor having a gate electrode 16, source/drain electrodes 20 and an active layer 22 sequentially formed on the transistor region TFT, wherein portions of a back surface of the active layer 22 are in contact with the source/drain electrodes 20. Here, the back surface of the active layer 22 faces toward the substrate 10.

An organic light-emitting display device according to another exemplary embodiment of the present invention includes a substrate 10 having a transistor region TFT and a thin-film transistor having a gate electrode 16, source/drain electrodes 20 and an active layer 22 sequentially formed on the transistor region TFT, wherein portions of a back surface of the active layer 22 are in contact with the source/drain electrodes 20, and a proportion of the gate electrode 16 which is overlapped by the source/drain electrodes 20 is 30% or less of a width of the gate electrode 16 when seen in a cross-section.

An organic light-emitting display device according to yet another exemplary embodiment of the present invention includes a substrate 10 having a pixel region PXL, a transistor region TFT and a capacitor region Cst, pixel electrodes 14 formed on the substrate 10, gate electrodes 16 formed on the pixel electrodes 14 of the transistor region TFT and the capacitor region Cst, a gate insulating film 18 formed on the gate electrodes 16, source/drain electrodes 20 formed on the gate insulating film 18 such that a recessed portion 20a exposing a portion of the gate insulating film 18 is formed at a location corresponding to a central portion of the gate electrode 16 of the transistor region TFT, an active layer 22 deposited in the recessed portion 20a and having portions 22a in contact with the source/drain electrodes 20 of the transistor region TFT and the other portion 22b in contact with the gate insulating film 18 at an inner surface of the recessed portion 20a, and a passivation film 24 formed on the active layer 22.

The substrate 10 may be made of a transparent glass material containing $SiO_2$ as a main component. However, the material that forms the substrate 10 is not limited to the transparent glass material. The substrate 10 may also be made of a transparent plastic material that may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

The substrate 10 has the transistor region TFT, the capacitor region Cst and the pixel region PXL on which a transistor, a capacitor and a pixel are formed, respectively. There are no clear boundaries between the transistor region TFT, the capacitor region Cst, and the pixel region PXL. Thus, a region of the substrate 10 on which a transistor is formed is defined as the transistor region TFT, and a region of the substrate 10 on which a capacitor is formed is defined as the capacitor region Cst.

In a bottom emission organic light-emitting display device in which an image is realized toward the substrate 10, the substrate 10 should be made of a transparent material. However, in a top emission organic light-emitting display device in which an image is realized away from the substrate 10, the substrate 10 may not necessarily be made of a transparent material. In this case, the substrate 10 may be made of metal. When the substrate 10 is made of metal, the substrate 10 may contain one or more materials selected from the group consisting of carbon (C), iron (Fe), chrome (Cr), manganese (Mn), nickel (Ni), titanium (Ti), molybdenum (Mo), and stainless steel (SUS). However, the material that forms the substrate 10 is not limited to the above materials. The substrate 10 may also be made of a metal foil.

A buffer layer 12 may further be formed on the substrate 10 to planarize the substrate 10 and to prevent penetration of impurities into the substrate 10. The buffer layer 12 may be a single layer of $SiO_x$, $SiN_x$, or $SiO_2N_x$, or a multilayer of these materials.

The pixel electrodes 14 may be formed on the buffer layer 12. In a bottom emission organic light-emitting display device, the pixel electrodes 14 may be a transparent conductive material. The transparent conductive material may include one or more materials selected from indium tin oxide (ITO), indium zinc oxide (IZO), carbon nanotubes, a conductive polymer, and nanowires.

Although not shown in FIG. 3A, the pixel electrode 14 of the pixel region PXL receives a driving current from the source/drain electrode 20 of the transistor region TFT and causes a light-emitting layer (not shown) provided thereon to emit light using the driving current, thereby realizing a desired image on the organic light-emitting display device.

The gate electrodes 16 may be stacked on the pixel electrodes 14. The gate electrode 20 of the transistor region TFT transmits a gate signal to control the light emission of each pixel. The gate electrodes 20 may be a single layer of Al or an Al alloy, such as Cr—Al, Mo—Al, or Al—Nd, or a multilayer of a Cr or Mo alloy and an Al alloy stacked on the Cr or Mo alloy. In addition, the gate electrodes 20 may be formed as a triple layer of Mo—Al—Mo stacked sequentially from the bottom.

The gate insulating film 18 may be formed on the gate electrodes 16 to cover the gate electrodes 16 and to insulate the gate electrode 16 of the transistor region TFT from the active layer 22. Like the buffer layer 12, the gate insulating film 18 may be a single layer of $SiO_2$, $SiN_x$, or $SiO_2N_x$, or a multilayer of these materials. The gate insulating film 16 may be made of the same material as the buffer layer 12 or a different material from that of the buffer layer 12.

The source/drain electrodes 20 may be formed on the gate insulating film 18 of the transistor region TFT and the capacitor region Cst. In exemplary embodiments, the source/drain electrodes 20 are stacked directly on the gate insulating film 18, and the source/drain electrodes 20 of the transistor region TFT electrically contact the back surface of the active layer 22 to selectively supply a driving current, as will be described later. The driving current is finally supplied to the pixel electrode 14 of the pixel region PXL so as to make the light-emitting layer (not shown) selectively emit light, thereby realizing an image.

The source/drain electrodes 20 may be made of any one material selected from Mo, Cr, W, MoW, Al, Al—Nd, Ti, TiN, Cu, a Mo alloy, an Al alloy, and a Cu alloy. The source/drain electrodes 20 may also be formed as a triple layer of Mo—Al—Mo.

The source/drain electrodes 20 may be separated from the gate electrodes 16 by the gate insulating film 18. The source/drain electrodes 20 may be formed above the gate electrodes 16 such that the recessed portion 20a (see FIG. 7) is formed at a location corresponding to the central portion of the gate electrode 16 of the transistor region TFT to externally expose a portion of the gate insulating film 18 from the source/drain electrodes 20 of the transistor region TFT.

That is, when seen in the cross-sectional view of FIG. 3A, an aperture is formed in a central portion of the source/drain electrodes 20 of the transistor region TFT and exposes the gate insulating film 18 under the source/drain electrodes 20.

The source/drain electrode 20 of the capacitor region Cst forms a metal-insulator-metal (MIM) capacitor together with the gate electrode 16 thereunder. Thus, the thin-film transistor according to the current exemplary embodiments can be driven by a constant voltage.

As described above, the active layer 22 may be deposited in the recessed portion 20a formed in the central portion of the source/drain electrodes 20 of the transistor region TFT. The active layer 22 may be controlled to be a conductor or a nonconductor by the gate electrode 16 to control a driving current that flows to the source/drain electrodes 20.

Figure 8:
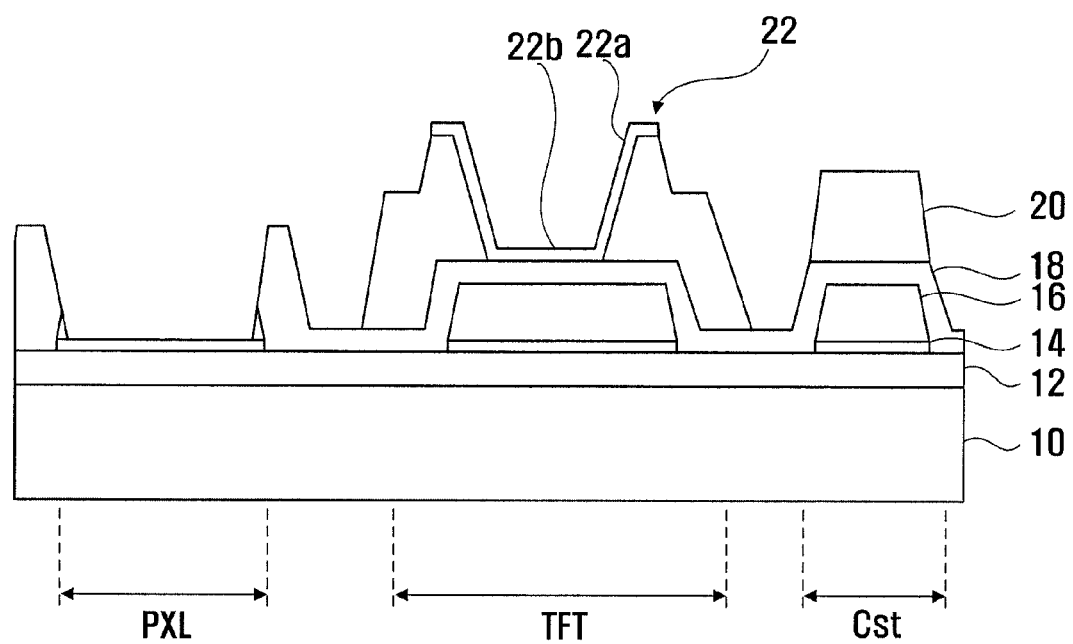

As shown in FIG. 3A, the portions 22a of the back surface of the active layer 22 may be in direct contact with the source/drain electrodes 20 of the transistor region TFT, and the other portion 22b of the back surface of the active layer 22 may be in direct contact with the gate insulating film 18 (see FIG. 8).

Specifically, the active layer 22 may contact the source/drain electrodes 20 of the transistor region TFT at the inner surface of the recessed portion 20a formed in the central portion of the source/drain electrodes 20.

That is, the thin-film transistor according to the current exemplary embodiments includes the gate electrodes 16, the source/drain electrodes 20, and the active layer 22 that are stacked sequentially. In the thin-film transistor according to the current exemplary embodiments, the contact area between the source/drain electrodes 20 of the transistor region TFT and the active layer 22 is wide. However, as shown in FIGS. 3A and 3B, the overlap width and/or area between the gate electrode 16 and the source/drain electrodes 20 of the transistor region TFT is significantly reduced as compared with the conventional organic light-emitting display device. Furthermore, since a width of a channel region in which the active layer 22 is formed can be reduced, the area occupied by the thin-film transistor can be minimized or reduced.

Figure 1B:
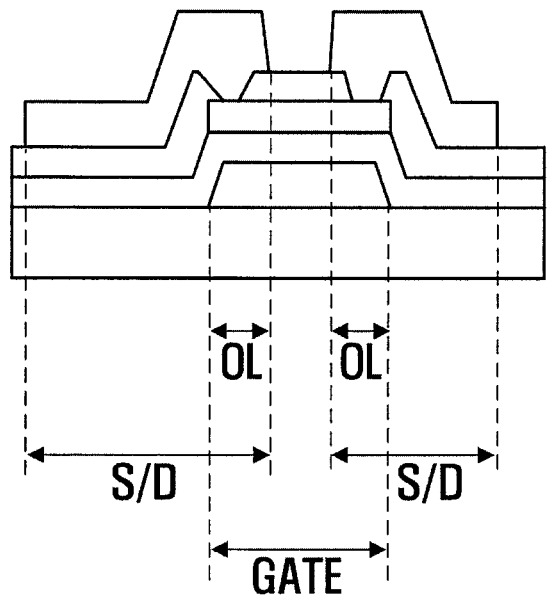
Figure 2:
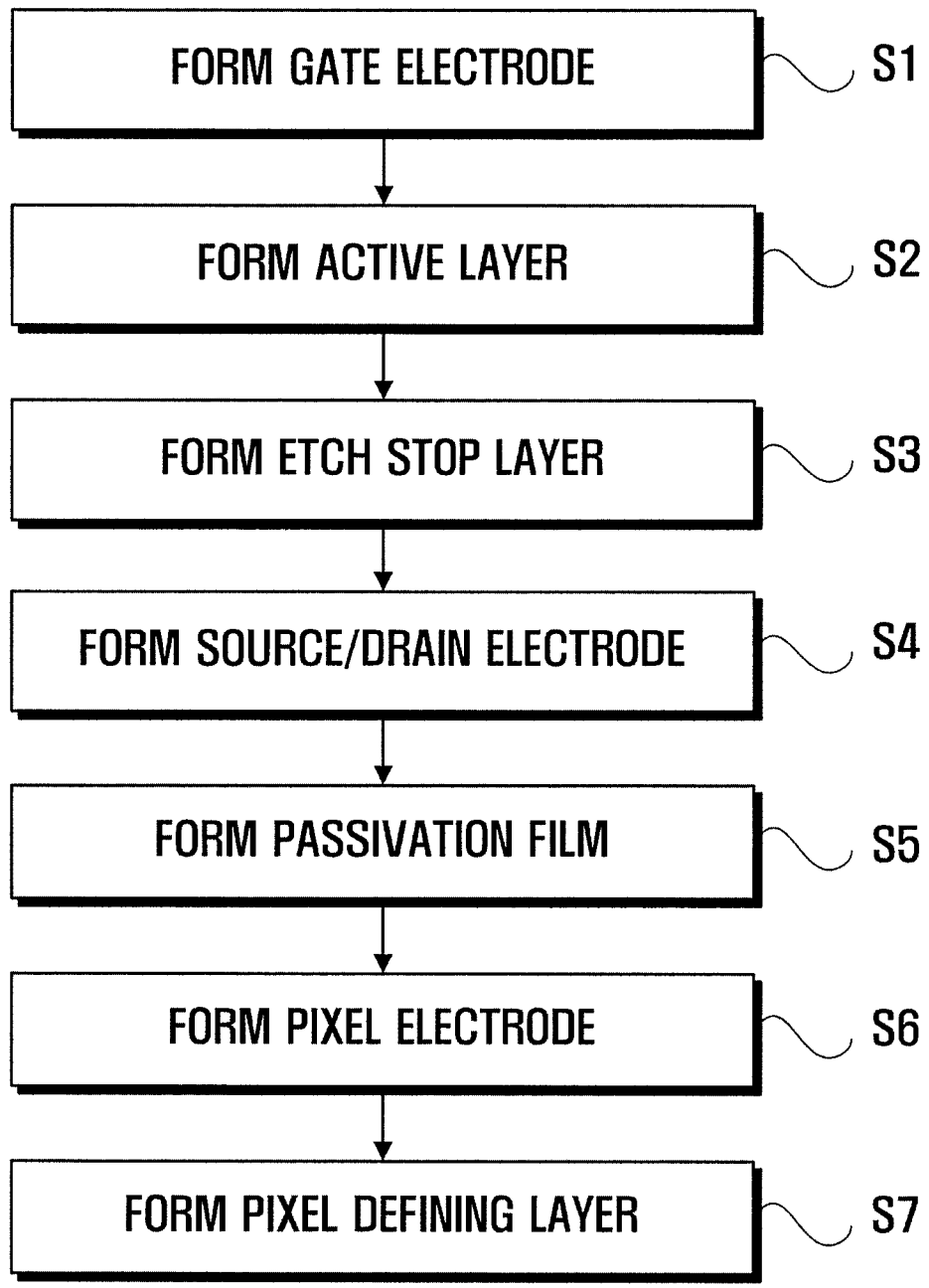
FIG. 2 is a flowchart illustrating a conventional method of manufacturing an organic light-emitting display device.

Specifically, as described above with reference to FIG. 1B, in the conventional organic light-emitting display device, the active layer OXIDE is formed above the gate electrode GATE of the transistor region TFT, and then the source/drain electrodes S/D are formed on the active layer OXIDE. This structure makes it difficult to reduce parasitic capacitance generated by the overlap area between the gate electrode GATE and the source/drain electrodes S/D of the transistor region TFT.

On the other hand, in the thin-film transistor according to the current exemplary embodiments, after the source/drain electrodes 20 are formed at the transistor region TFT, the active layer 22 is formed in the recessed portion 20a of the source/drain electrodes 20. This structure significantly reduces an overlap area OL between the gate electrode 16 and the source/drain electrodes 20 of the transistor region TFT, thus reducing the parasitic capacitance between the gate electrode 16 and the source/drain electrodes 20.

Specifically, in the cross-sectional views of FIGS. 3A through 3C, a proportion of the gate electrode 16 which is overlapped by the source/drain electrodes 20 at the transistor region TFT may be 30% or less of the width of the gate electrode 16. Accordingly, the parasitic capacitance between the gate electrode 16 and the source/drain electrodes 20 of the transistor region TFT may be reduced by 60% or more to 50 fF or less, compared, with the parasitic capacitance of the conventional organic light-emitting display device.

Further, if the source/drain electrodes 20 and the active layer 22 of the transistor region TFT are formed such that a width of the recessed portion 20a is equal to or greater than the width of the gate electrode 16 in the cross-section of the thin-film transistor according to the current exemplary embodiments, the overlap area between the gate electrode 16 and the source/drain electrodes 20 can be completely removed as shown in FIG. 3C. In this case, the parasitic capacitance between the gate electrode 16 and the source/drain electrodes 20 can be reduced to nearly zero. The reduction or minimization of the parasitic capacitance can improve the device reliability, driving efficiency and reliability of the thin-film transistor according to the current exemplary embodiments.

The active layer 22 may contain one or more of gallium-indium-zinc oxide (GIZO) and hafnium-indium-zinc oxide (HIZO). However, the present invention is not limited thereto, and any suitable oxide that can replace partially doped polysilicon can be used.

As described above, the active layer 22 is very sensitive to the air and can be easily damaged. Therefore, the passivation film 24 functioning as an etch stop layer may be formed to cover the active layer 22. The passivation film 24 also electrically insulates the active layer 22 and keeps the active layer 22 isolated from the outside.

Like the buffer layer 12, the passivation film 24 may be a single layer of $SiO_2$, SiNx or $SiO_2Nx$, or a multilayer of these materials.

When the passivation film 24 is formed as a multilayer of $SiO_2$, SiNx, and $SiO_2Nx$, a layer of $SiO_2$ or a layer of $SiO_2Nx$ may be formed at an interface of the passivation film 24 with the active layer 22, in view of interface characteristics with the oxide active layer 22. Then, a SiNx layer may be formed on the $SiO_2$ or $SIO_2Nx$ layer.

A pixel defining layer 26 that defines the pixel region PXL may be formed on the passivation film 24. The pixel defining layer 26 is formed on the entire substrate 10 to cover the thin-film transistor and the capacitor. An aperture exposing the whole or a part of the pixel electrode 14 of the pixel region PXL is formed in the pixel defined layer 26 to define the pixel region PXL.

The pixel defining layer 26 may be made of an inorganic material such as $SiO_2$, SiNx, or $SiO_2Nx$, or a multilayer of these materials.

Figure 4:
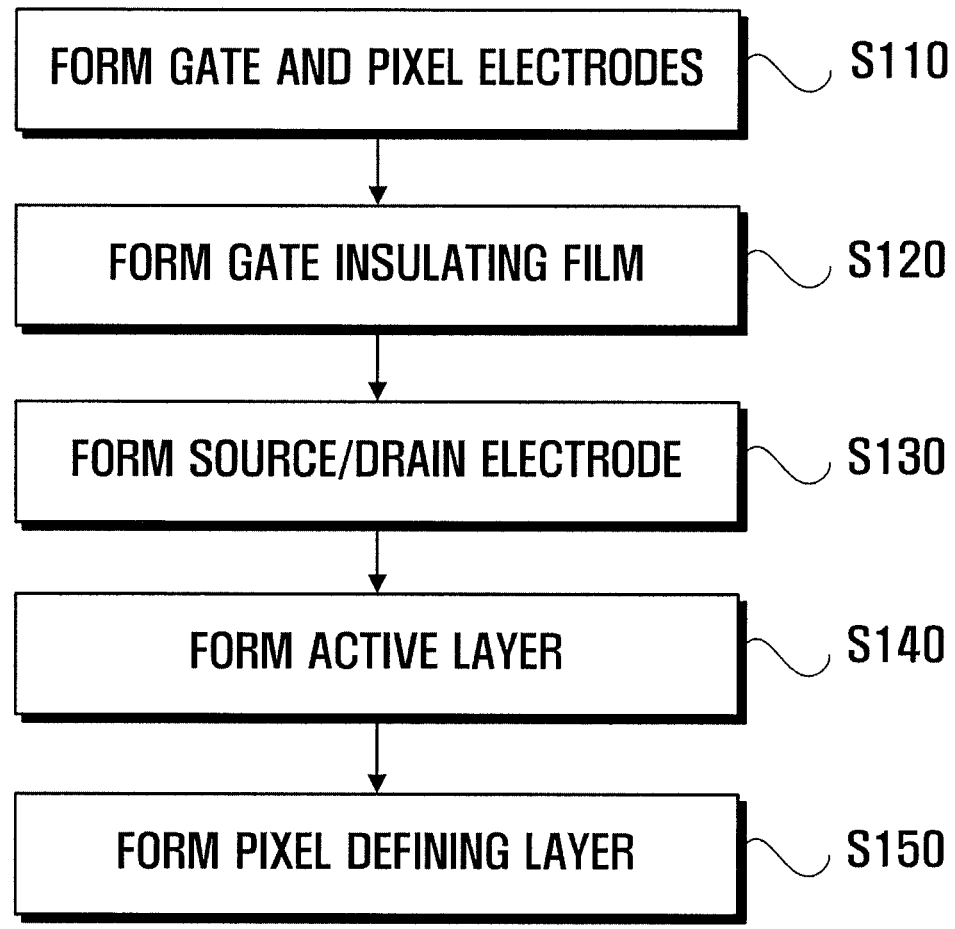
FIG. 4 is a flowchart illustrating a method of manufacturing an organic light-emitting display device according to an exemplary embodiment of the present invention.

Hereinafter, a method of manufacturing an organic light-emitting display device according to an exemplary embodiment of the present invention will be described with reference to FIGS. 4 through 10. FIG. 4 is a flowchart illustrating a method of manufacturing an organic light-emitting display device according to an exemplary embodiment of the present invention. FIGS. 5 through 10 are cross-sectional views sequentially illustrating the method of manufacturing an organic light-emitting display device according to the exemplary embodiment of FIG. 4.

The method of manufacturing an organic light-emitting display device according to the current exemplary embodiment includes forming gate electrodes and pixel electrodes on a substrate having a pixel region, a transistor region and a capacitor region (operation S110), forming a gate insulating film on the gate electrodes (operation S120), forming source/drain electrodes on the gate insulating film (operation S130), forming an active layer on the source/drain electrodes of the transistor region (operation S140), and forming a passivation film and a pixel defining layer and then etching the passivation film and the pixel defining layer of the pixel region to expose the pixel electrode of the pixel region (operation S150), wherein portions of a back surface of the active layer is in contact with the source/drain electrodes of the transistor region.

Figure 5:
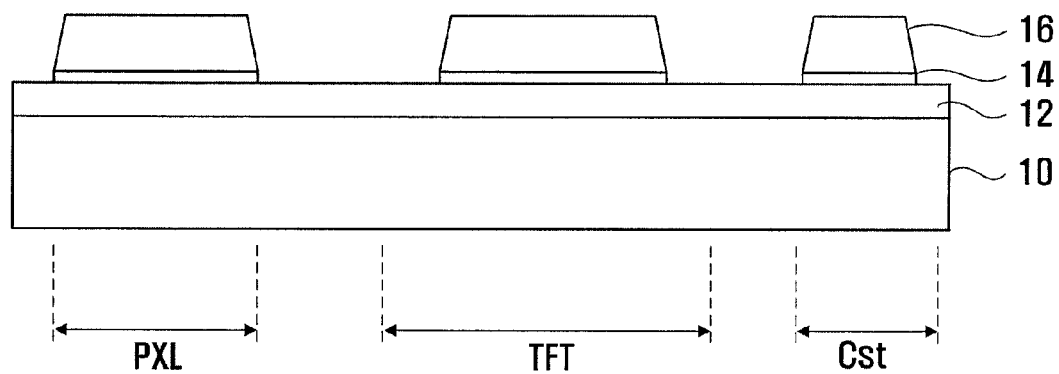
FIGS. 5 through 10 are cross-sectional views sequentially illustrating the method of manufacturing an organic light-emitting display device according to the exemplary embodiment of FIG. 4.

Referring to FIG. 5, a buffer layer 12 is formed on a substrate 10 to planarize the substrate 10 and to prevent penetration of foreign substances into the substrate 10. Then, a photoresist is formed on the buffer layer 12 and is etched and patterned using a first mask to form pixel electrodes 14 and gate electrodes 16 (operation S110). The pixel electrodes 14 may be formed using ITO, and the gate electrodes 16 may be formed as a single layer of Mo, MoW, or an Al alloy, or a multilayer of an alloy such as Mo—Al—Mo.

Figure 6:
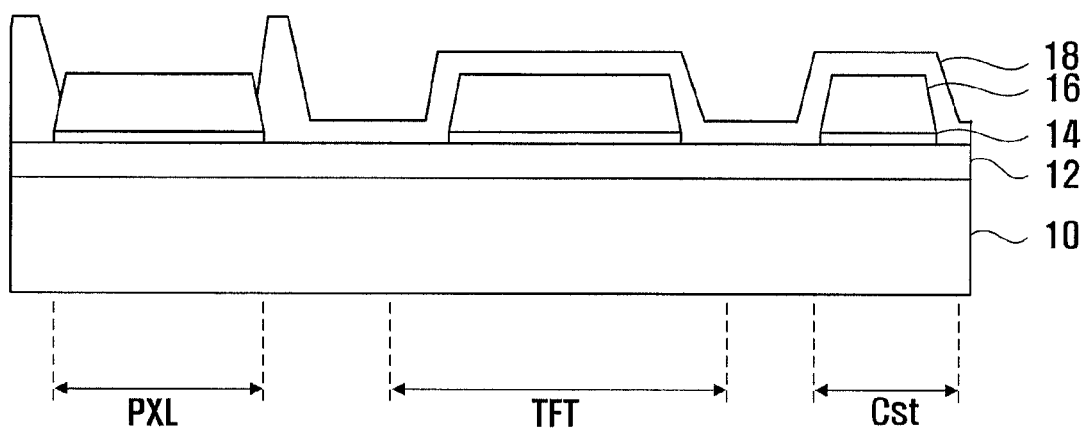

Referring to FIG. 6, a gate insulating film 18 is formed on the gate electrodes 16 and then patterned using a second mask to expose the gate electrode 16 of a pixel region PXL (operation S120). Although not shown in the drawing, the gate electrodes 16 and/or the pixel electrodes 14 and contact holes, if any, may also be patterned together.

The gate insulating film 18 may be made of TEOS SiOx, SION, SiNx, or a combination of these materials. Alternatively, TEOS oxide may be used instead of SiOx.

Figure 7:
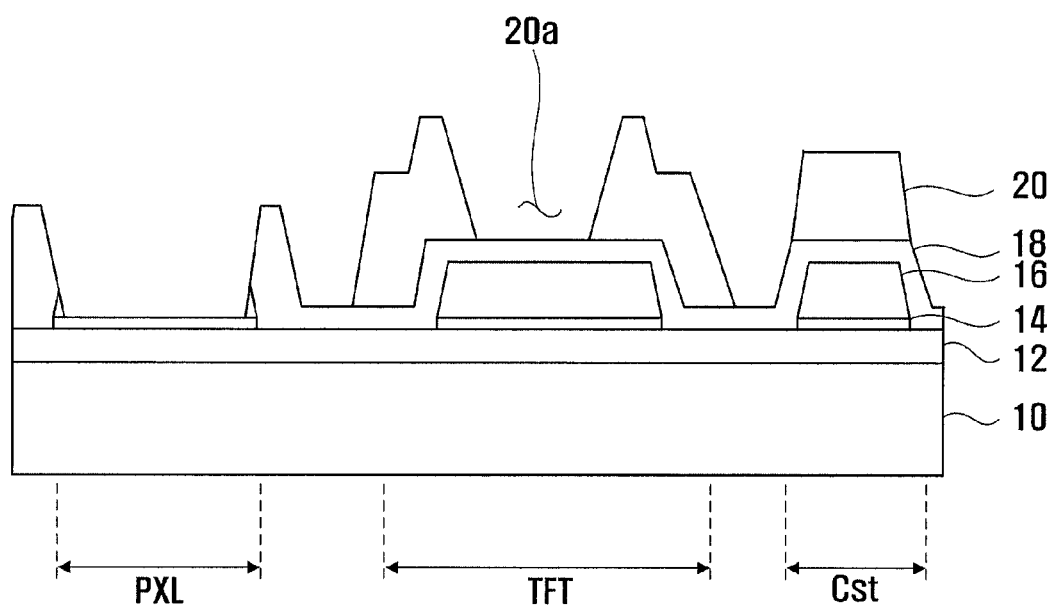

Referring to FIG. 7, source/drain electrodes 20 are formed on the gate insulating film 18 of a transistor region TFT and a capacitor region Cst to correspond to the gate electrodes 16 (operation S130). The source/drain electrodes 20 may be formed as a single layer of Mo or MoW, or a triple layer of Mo—Al—Mo. A material for forming the source/drain electrodes 20 may be deposited on the entire surface of the substrate 10 and then patterned using a third mask.

When the material for forming the source/drain electrodes 20 is patterned to form the source/drain electrodes 20 above the gate electrodes 16, a recessed portion 20a exposing a portion of the gate insulating film 18 may further be formed at a location corresponding to a central portion of the gate electrode 16 of the transistor region TFT.

Referring to FIG. 8, an active layer 22 is formed on the source/drain electrodes 20 of the transistor region TFT (operation S140). The active layer 22 may be made of, but is not limited to, an oxide such as GIZO or HIZO. The active layer 22 may be formed on the substrate 10 by sputtering and then patterned using a fourth mask.

As described above, portions 22a of a back surface of the active layer 22 may be in contact with the source/drain electrodes 20 of the transistor region TFT, and the other portion 22b of the back surface of the active layer 22 may be in contact with the gate insulating film 18.

Specifically, the active layer 22 may be formed to contact the source/drain electrodes 20 of the transistor region TFT at an inner surface of the recessed portion 20a. Accordingly, as described above, an overlap area OL between the gate electrode 16 and the source/drain electrodes 20 of the transistor region TFT is significantly reduced, thereby reducing the parasitic capacitance between the gate electrode 16 and the source/drain electrodes 20.

Further, as described above, when the source/drain electrodes 20 and the active layer 22 of the transistor region TFT are formed such that a width of the recessed portion 20a is equal to or greater than a width of the gate electrode 16 in the cross-section of a thin-film transistor, the overlap area between the gate electrode 16 and the source/drain electrodes 20 can be completely removed.

In this case, the parasitic capacitance between the gate electrode 16 and the source/drain electrode 20 can be minimized or reduced to nearly zero. The reduction or minimization of the parasitic capacitance can improve the device reliability, driving efficiency and reliability of a thin-film transistor manufactured according to the current exemplary embodiment.

Figure 9:
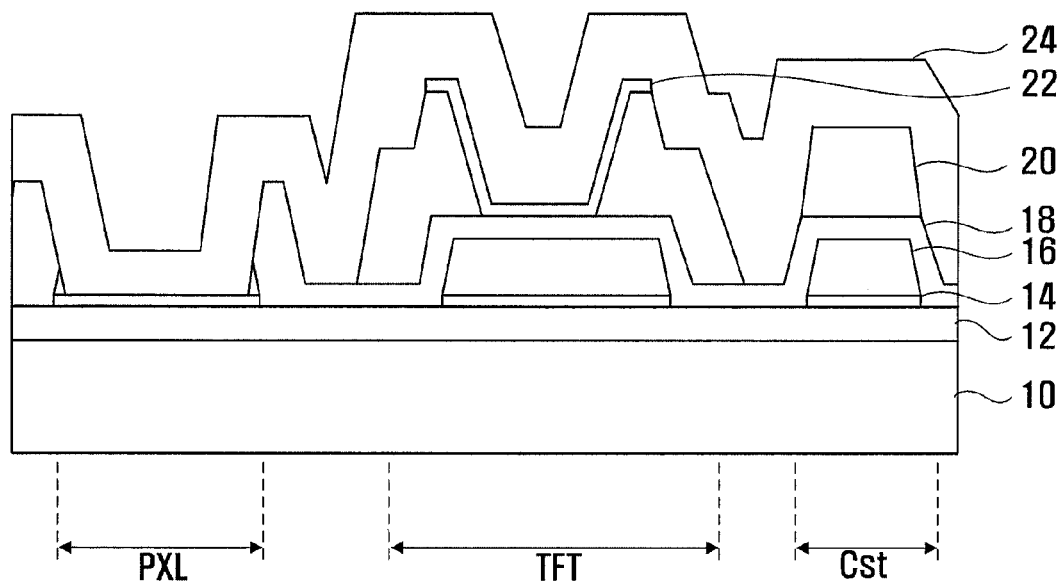

Referring to FIG. 9, a passivation film 24 is formed on the entire substrate 10 to cover the active layer 22, for example, made of an oxide. The passivation film 24 may be formed by chemical vapor deposition (CVD) or physical vapor deposition (PVD). In addition, the passivation film 24 may be a single layer of SiOx, SiNx, $SiO_2Nx$, or a multilayer of these materials.

Figure 10:
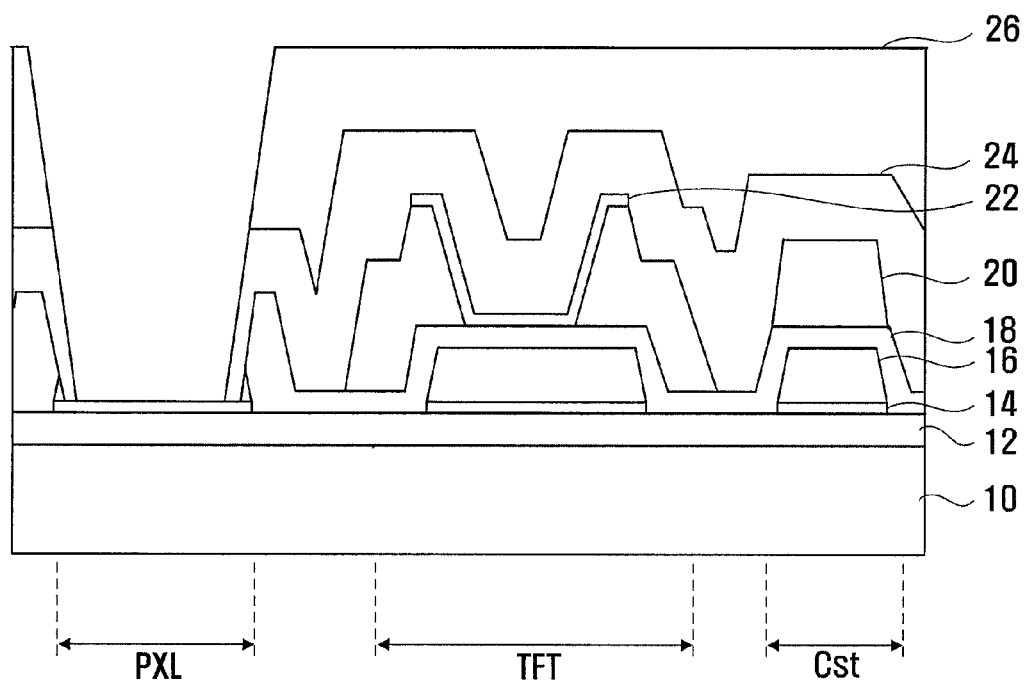

Referring to FIG. 10, a pixel defining layer 26 is formed on the passivation film 24, and portions of the passivation film 24 and the pixel defining layer 26 at the pixel region PXL are removed using a fifth mask, thereby exposing the pixel electrode 14 of the pixel region PXL.

Specifically, an aperture region may be formed by patterning the pixel defining layer 26 of the pixel region PXL using the fifth mask. Then, the passivation film 24 under the aperture region of the pixel defining layer 26 may be removed by a dry-etching process before a curing process of the pixel defining layer 26.

The pixel defining layer 26 may be made of an inorganic or organic material. When made of an inorganic material, the pixel defining layer 26, like the passivation film 24 thereunder, may be formed as a single layer of SiOx, SiNx, or $SiO_2Nx$, or a multilayer of these materials.

As described above, in the method of manufacturing an organic light-emitting display device according to the current exemplary embodiment, an organic light-emitting display device can be manufactured using a smaller number of masks than in a conventional method of manufacturing an organic light-emitting display device which includes an oxide active layer. In addition, the method according to the current exemplary embodiment has been improved in terms of process and time.

Figure 11:
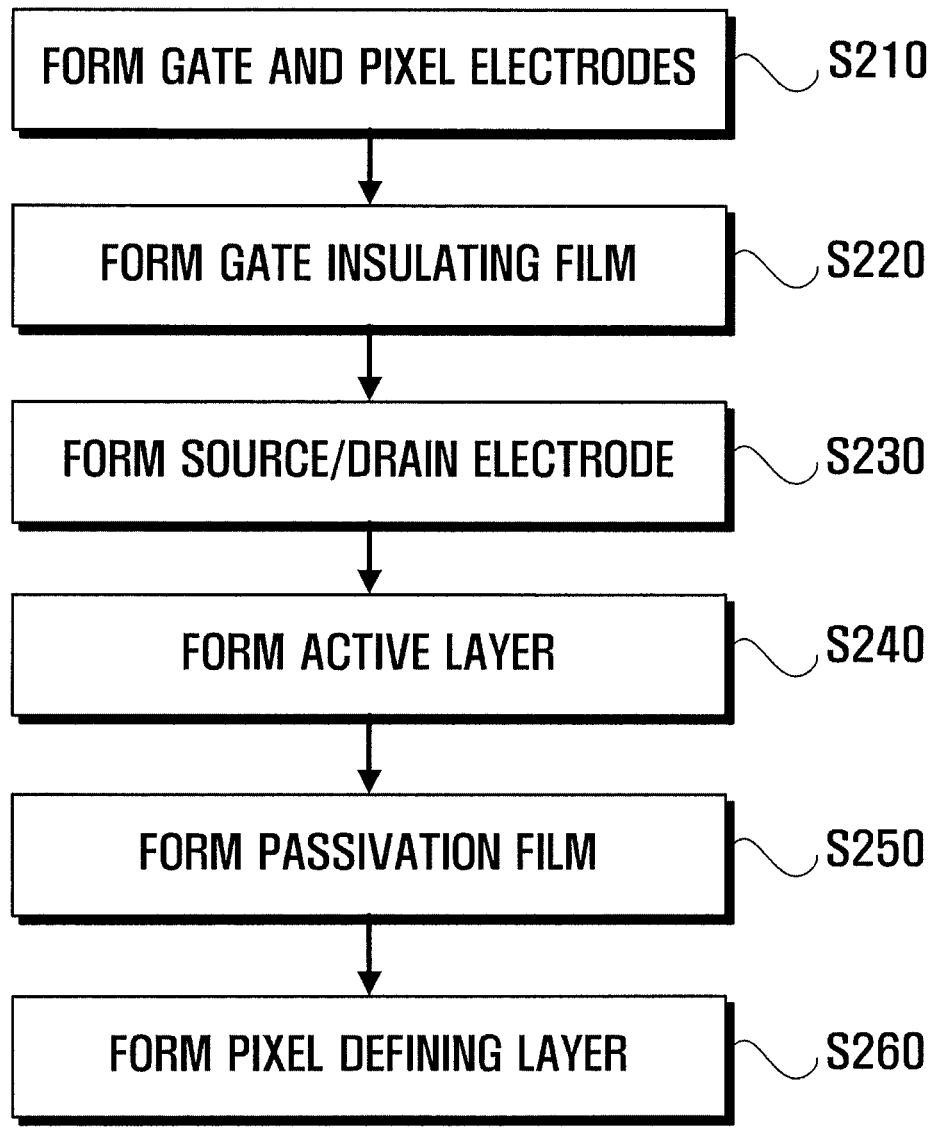
FIG. 11 is a flowchart illustrating a method of manufacturing an organic light-emitting display device according to another exemplary embodiment of the present invention.
Figure 12:
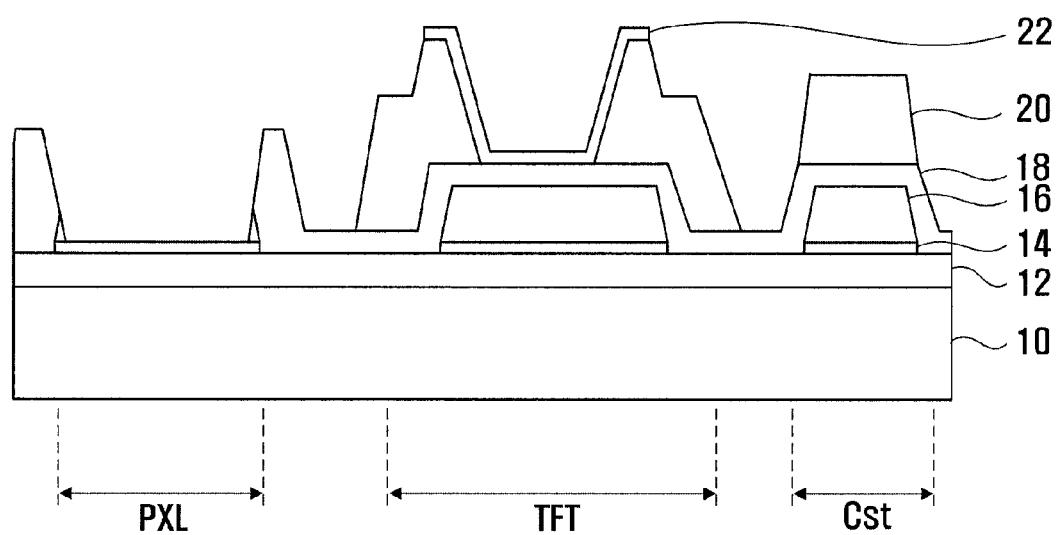
FIGS. 12 through 14 are cross-sectional views sequentially illustrating the method of manufacturing an organic light-emitting display device according to the exemplary embodiment of FIG. 11.
Figure 13:
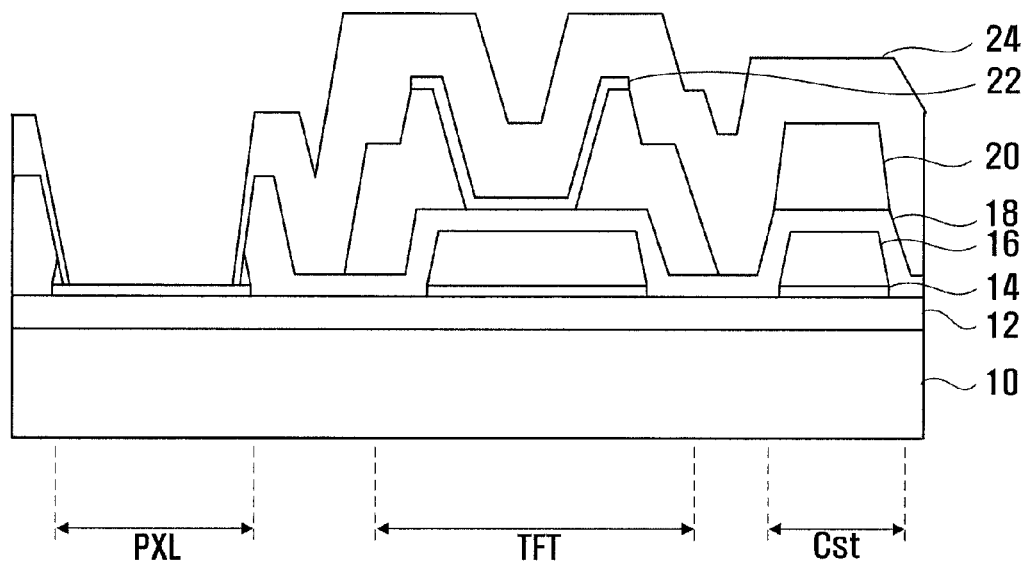
Figure 14:
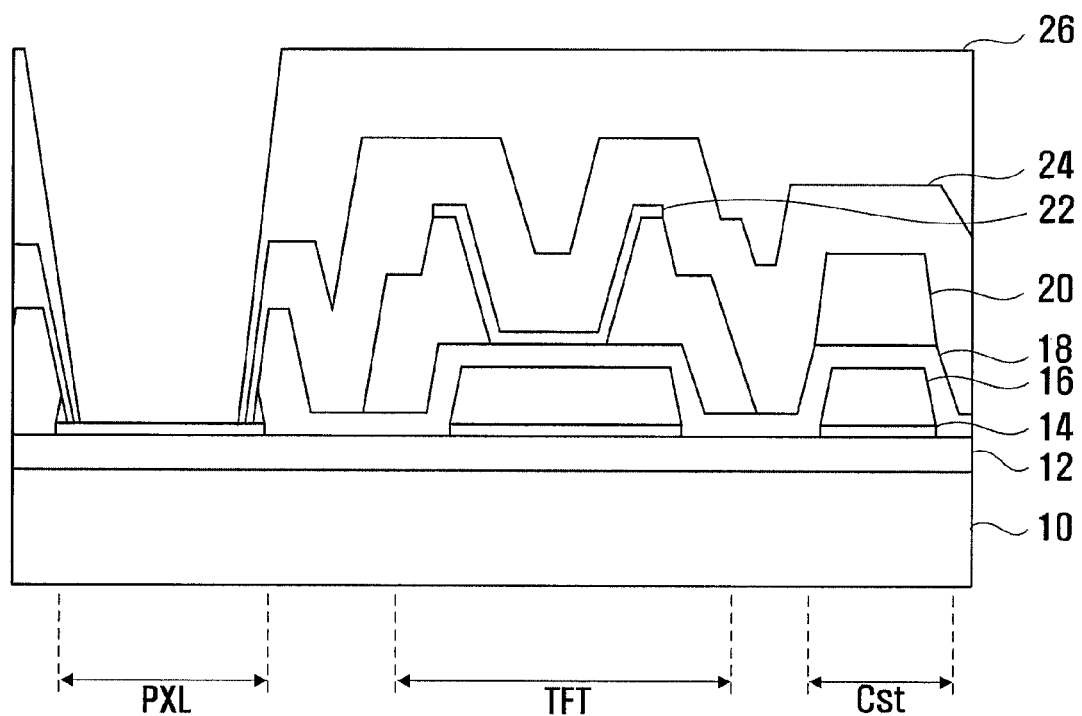

Hereinafter, a method of manufacturing an organic light-emitting display device according to another exemplary embodiment of the present invention will be described with reference to FIGS. 11 through 14. FIG. 11 is a flowchart illustrating a method of manufacturing an organic light-emitting display device according to another exemplary embodiment of the present invention. FIGS. 12 through 14 are cross-sectional views sequentially illustrating the method of manufacturing an organic light-emitting display device according to the exemplary embodiment of FIG. 11.

The method of manufacturing an organic light-emitting display device according to the current exemplary embodiment includes forming gate electrodes and pixel electrodes on a substrate having a pixel region, a transistor region, and a capacitor region (operation S210); forming a gate insulating film on the gate electrodes (operation S220); forming source/drain electrodes on the gate insulating film (operation S230); forming an active layer on the source/drain electrodes of the transistor region (operation S240); forming a passivation film and then etching the passivation film of the pixel region to expose the pixel electrode of the pixel region (operation S250); and forming a pixel defining layer on the passivation film and then etching the pixel defining layer of the pixel region to expose the pixel electrode of the pixel region (operation S260), wherein portions of a back surface of the active layer is in contact with the source/drain electrodes of the transistor region TFT.

The method of manufacturing an organic light-emitting display device according to the current exemplary embodiment is the same as the method of manufacturing an organic light-emitting display device according to the previous exemplary embodiment, except that the passivation film and the pixel defined layer are patterned separately using separate masks in the current exemplary embodiment.

That is, after an active layer 22 is formed on a substrate 10 as shown in FIG. 12, a passivation film 24 is formed and then patterned using a fifth mask to expose a pixel electrode 14 of a pixel region PXL as shown in FIG. 13.

Next, referring to FIG. 14, a pixel defined layer 26 is formed on the resultant structure and then patterned using a separate mask, e.g., a sixth mask to expose the pixel electrode 14 of the pixel region PXL.

The method of manufacturing an organic light-emitting display device according to the current exemplary embodiment includes an additional etching process using a mask, compared with the method of manufacturing an organic light-emitting display device according to the previous exemplary embodiment. However, the passivation film 24 can be etched with more precision.

While the present invention has been particularly shown and described with reference to exemplary embodiments thereof, it will be understood by those of ordinary skill in the art that various changes in form and detail may be made therein without departing from the spirit and scope of the present invention as defined by the following claims and equivalents thereof. The exemplary embodiments should be considered in a descriptive sense only and not for purposes of limitation.

What is claimed is:

1. An organic light-emitting display device comprising:
   a substrate having a pixel region, a transistor region, and a capacitor region;
   pixel electrodes on the substrate;
   gate electrodes on the pixel electrodes of the transistor region and the capacitor region, respectively;
   a gate insulating film on the gate electrodes;
   source/drain electrodes on the gate insulating film such that a recessed portion exposing a portion of the gate insulating film is located at a location corresponding to a central portion of the gate electrode of the transistor region;
   an active layer in the recessed portion and having portions in contact with the source/drain electrodes of the transistor region, and an other portion in contact with the gate insulating film at an inner surface of the recessed portion; and a passivation film on the active layer.

2. The device of claim 1, wherein the pixel electrodes comprise indium tin oxide (ITO).

3. The device of claim 1, wherein the active layer comprises at least one of GIZO or HIZO.

4. The device of claim 1, wherein the passivation film comprises a multilayer film comprising at least one of a silicon oxide film, a silicon nitride film, or a silicon oxynitride film.

5. The device of claim 4, wherein the silicon oxide film or the silicon oxynitride film is formed at an interface of the passivation film with the active layer, and the silicon nitride film is formed on the silicon oxide film or the silicon oxynitride film.

6. A method of manufacturing an organic light-emitting display device, the method comprising:

forming gate electrodes and pixel electrodes on a substrate having a pixel region, a transistor region, and a capacitor region;

forming a gate insulating film on the gate electrodes;

forming source/drain electrodes on the gate insulating film;

forming an active layer on the source/drain electrode of the transistor region; and forming a passivation film and a pixel defining layer, and then etching the passivation film and the pixel defining layer of the pixel region to expose the pixel electrode of the pixel region, wherein a portion of the source/drain electrode of the transistor region is between the active layer and the substrate.

7. The method of claim 6, wherein the exposing of the pixel electrode of the pixel region comprises:

forming an aperture region by patterning the pixel defining layer of the pixel region; and dry-etching the passivation film disposed under and exposed through the aperture region of the pixel defining layer before a curing process of the pixel defining layer.

8. A method of manufacturing an organic light-emitting display device, the method comprising:

forming gate electrodes and pixel electrodes on a substrate having a pixel region, a transistor region, and a capacitor region;

forming a gate insulating film on the gate electrodes;

forming source/drain electrodes on the gate insulating film;

forming an active layer on the source/drain electrode of the transistor region;

forming a passivation film and then etching the passivation film of the pixel region to expose the pixel electrode of the pixel region; and forming a pixel defining layer on the passivation film and then etching the pixel defining layer of the pixel region to expose the pixel electrode of the pixel region, wherein a portion of the source/drain electrodes of the transistor region is between the active layer and the substrate.

9. The method of claim 8, wherein in the forming of the active layer, portions of a back surface of the active layer are in contact with the source/drain electrodes, and an other portion of the back surface of the active layer is made to contact the gate insulating film.

10. The method of claim 8, wherein the forming of the source/drain electrodes on the gate insulating film further comprises forming a recessed portion, which exposes a portion of the gate insulating film, at a location corresponding to a central portion of the gate electrode of the transistor region.

11. The method of claim 10, wherein in the forming of the active layer, the active layer is made to contact the source/drain electrodes of the transistor region at an inner surface of the recessed portion.

12. The method of claim 11, wherein a width of the recessed portion is greater than or equal to a width of the gate electrode of the transistor region.

13. The method of claim 8, wherein the active layer comprises at least one of GIZO or HIZO.

* * * * *